(12) United States Patent
Fujiwara et al.

(10) Patent No.: US 7,072,181 B2
(45) Date of Patent: Jul. 4, 2006

(54) HEAT DISSIPATING DEVICE AND ELECTRONIC APPARATUS INCLUDING THE SAME

(75) Inventors: Nobuto Fujiwara, Ome (JP); Kenichi Ishikawa, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 10/763,419

(22) Filed: Jan. 26, 2004

(65) Prior Publication Data
US 2004/0170000 A1 Sep. 2, 2004

(30) Foreign Application Priority Data
Jan. 27, 2003 (JP) .............................. 2003-017343

(51) Int. Cl.
*H05K 7/20* (2006.01)
(52) U.S. Cl. ..................... 361/700; 165/185; 165/80.3; 165/104.33; 257/714; 257/715
(58) Field of Classification Search ................ 361/700, 361/702, 703, 704; 165/185, 80.3, 104.33
See application file for complete search history.

(56) References Cited

U.S. PATENT DOCUMENTS

| | | | |
|---|---|---|---|
| 6,163,073 A | | 12/2000 | Patel |
| 6,263,959 B1 * | | 7/2001 | Ikeda et al. ............. 165/104.26 |
| 6,317,322 B1 * | | 11/2001 | Ueki et al. ................. 361/700 |
| 6,382,306 B1 * | | 5/2002 | Hsu ........................... 165/80.3 |
| 6,424,528 B1 * | | 7/2002 | Chao ........................... 361/700 |
| 2001/0025701 A1 * | | 10/2001 | Ikeda et al. ................. 165/80.3 |
| 2002/0007555 A1 * | | 1/2002 | Ikeda et al. ............. 29/890.032 |
| 2002/0021556 A1 * | | 2/2002 | Dibene et al. ............... 361/704 |
| 2002/0080584 A1 * | | 6/2002 | Prasher et al. .............. 361/702 |
| 2002/0118511 A1 * | | 8/2002 | Dujari et al. ................ 361/703 |

FOREIGN PATENT DOCUMENTS

| | | |
|---|---|---|
| JP | 59-0094595 A | 1/1984 |
| JP | 59-83047 U | 6/1984 |
| JP | 04-361561 A | 12/1992 |
| JP | 07-050494 A | 2/1995 |
| JP | 2000-216309 A | 8/2000 |
| JP | 2000-220973 A | 8/2000 |
| JP | 2002-76224 | 3/2002 |

* cited by examiner

*Primary Examiner*—Boris Chérvinsky
*Assistant Examiner*—Biju Chandran
(74) *Attorney, Agent, or Firm*—Pillsbury Winthrop Shaw Pittman, LLP

(57) ABSTRACT

A heat dissipating device includes a heat receiving unit having a heat receiving surface thermally connected to a heat generating object and a heat dissipating surface in an opposite to the receiving surface, a heat transferring unit mounted on the dissipating surface, transferring the heat received in the heat receiving surface, and diffusing the transferred heat to the dissipating surface, and a heat dissipating unit mounted on the dissipating surface and dissipating the diffused heat. An electronic apparatus includes a circuit board having an electronic part generating heat, a main body installing the circuit board, and the heat dissipating device described above.

8 Claims, 4 Drawing Sheets

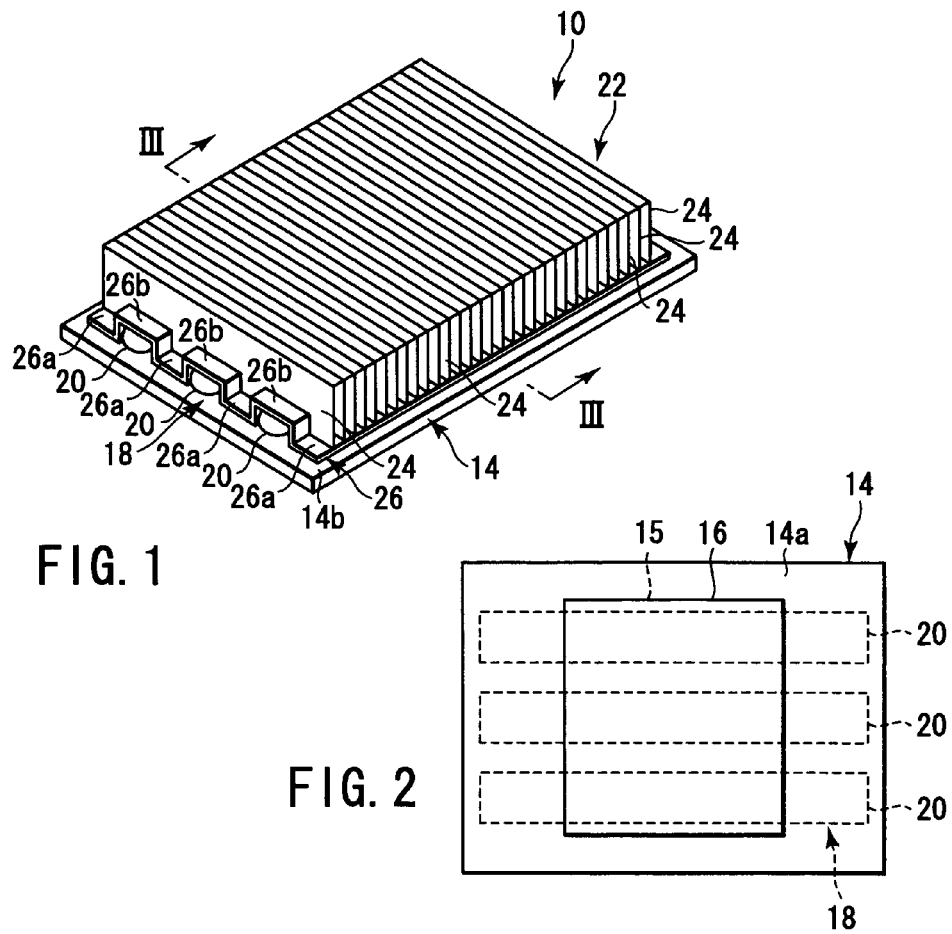
FIG. 1
FIG. 2
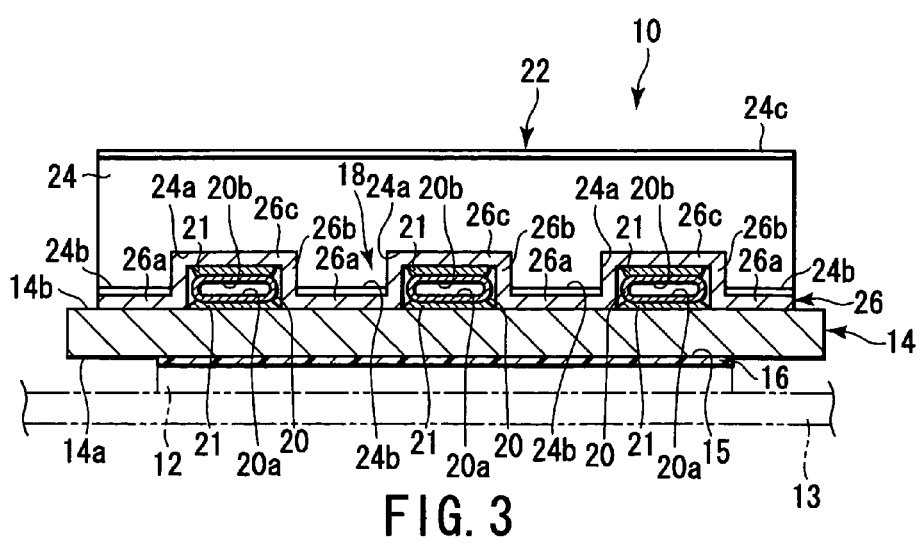
FIG. 3

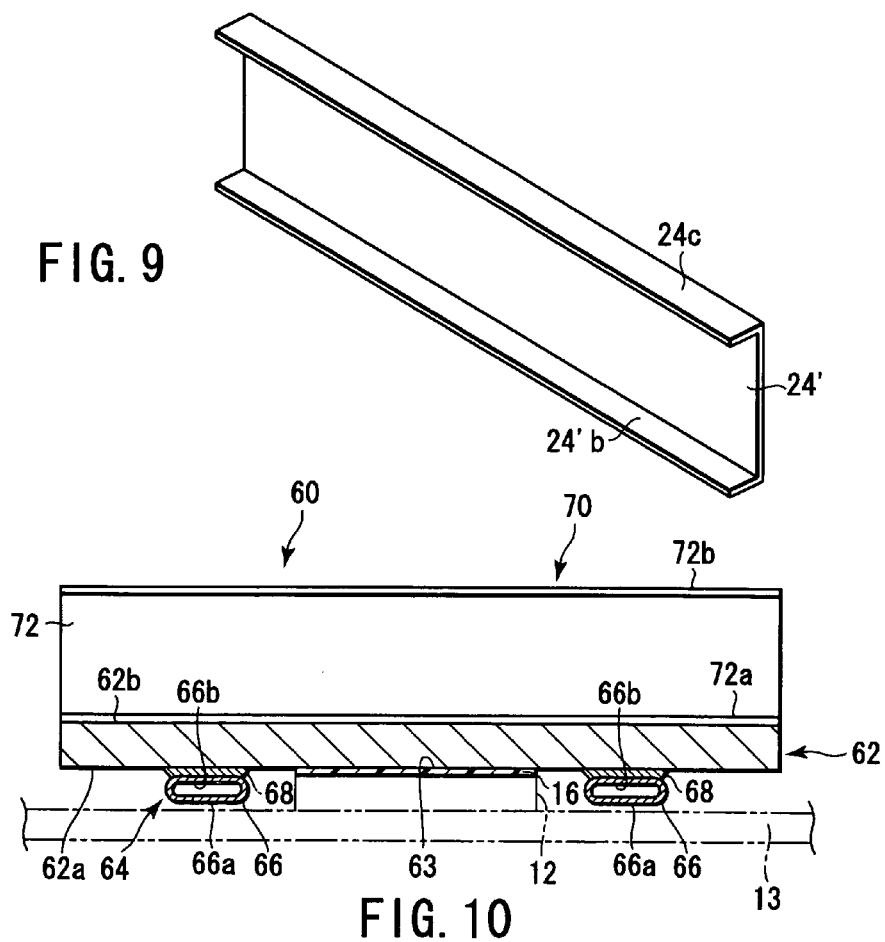
FIG. 9
FIG. 10
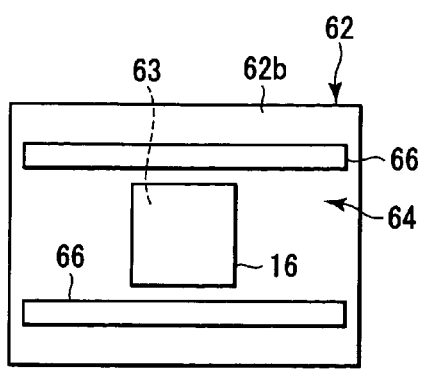
FIG. 11
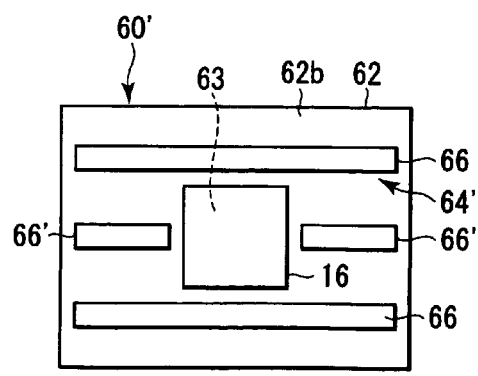
FIG. 12

HEAT DISSIPATING DEVICE AND ELECTRONIC APPARATUS INCLUDING THE SAME

CROSS-REFERENCE TO RELATED APPLICATIONS

This application is based upon and claims the benefit of priority from the prior Japanese Patent Application No. 2003-017343, filed Jan. 27, 2003, the entire contents of which are incorporated herein by reference.

BACKGROUND OF THE INVENTION

1. Field of the Invention

The present invention relates to a heat dissipating device which dissipates heat from a heat generating object, and an electronic apparatus which includes the heat dissipating device.

2. Description of the Related Art

The heat dissipating device, which dissipates heat from the heat generating object such an electronic part as a semiconductor chip, have been well known. A specification of U.S. Pat. No. 6,163,073 discloses a heat dissipating device which comprises a heat sink having a comb-shaped cross section and being integrally made of aluminum, and a heat pipe arranged in a groove formed in a flat surface of the heat sink. An electronic module (packaged-integrated-chip) as a heat generating object is thermally connected to a predetermined position on the flat surface of the heat sink, and the electronic module covers a part of the heat pipe. Heat generated by the electronic module is transferred away from the electronic module in the heat sink by the heat pipe, is diffused in the heat sink during the heat transfer, and is finally dissipated from a plurality of fins of the heat sink.

The heat sink having the plurality of fins is manufactured by a machinework or a die casting.

Heat dissipating efficiency of the plural fins of such a heat sink as described above becomes higher, as the thickness of each fin becomes thinner and/or as the number of fins becomes larger.

The heat dissipating efficiency of the plural fins of the heat sink which has the plurality of fins manufactured by the machinework or the die casting, is limited in view of a manufacturing cost.

BRIEF SUMMARY OF THE INVENTION

According to an aspect of the present invention, a heat dissipating device which dissipates heat from a heat generating object comprises: a heat receiving unit having a heat receiving surface and a heat dissipating surface in an opposite side of the heat receiving surface, the heat receiving surface being thermally connected to the heat generating object; a heat transferring unit mounted on the heat dissipating surface of the heat receiving unit, transferring the heat received in the heat receiving unit, and diffusing the transferred heat to the heat dissipating surface; and a heat dissipating unit mounted on the heat dissipating surface of the heat receiving unit, and dissipating the diffused heat.

According to another aspect of the present invention, a heat dissipating device dissipating heat from a heat generating object comprises: a heat receiving unit having a heat receiving surface and a heat dissipating surface in an opposite side of the heat receiving surface, the heat receiving surface being thermally connected to the heat generating object; a heat transferring unit mounted on the heat receiving surface of the heat receiving unit with excluding a part of the heat receiving surface thermally connected to the heat generating object, transferring the heat received in the heat receiving unit, and diffusing the transferred heat to the heat dissipating surface; and a heat dissipating unit mounted on the heat dissipating surface of the heat receiving unit, and dissipating the diffused heat.

According to further aspect of the present invention, an electronic apparatus comprises: a circuit board which includes an electronic part generating heat; a main body which installs the circuit board; and a heat dissipating device dissipating the heat from the electronic part. The heat dissipating device includes: a heat receiving unit having a heat receiving surface and a heat dissipating surface in an opposite side of the heat receiving surface, the heat receiving surface being thermally connected to the electronic part; a heat transferring unit mounted on the heat dissipating surface of the heat receiving unit, transferring the heat received in the heat receiving surface, and diffusing the transferred heat to the heat dissipating surface; and a heat dissipating unit mounted on the heat dissipating surface of the heat receiving unit, and dissipating the diffused heat.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 1 is a perspective view of a heat dissipating device according to a first embodiment of the present invention;

FIG. 2 is a bottom view of the heat dissipating device of FIG. 1, in which a heat receiving surface of the heat dissipating device is shown;

FIG. 3 is a cross sectional view taken along a line of III—III in FIG. 1;

FIG. 9 is a perspective view of one of heat dissipating plates mounted on a heat dissipating unit of the heat dissipating device in FIG. 8;

FIG. 10 is a cross sectional view of a heat dissipating device according to a fourth embodiment of the present invention, the view being taken along a direction which is perpendicular to a longitudinal direction of each of heat pipes included in a heat transferring unit of the heat dissipating device;

FIG. 11 is a bottom view of the heat dissipating device of FIG. 10, in which a heat receiving surface of the heat dissipating device is shown; and FIG. 12 is a bottom view of a modification of the heat dissipating device according to the fourth embodiment of the present invention in FIG. 11, in which a heat receiving surface of the modification is shown.

DETAILED DESCRIPTION OF THE INVENTION

Figure 4:
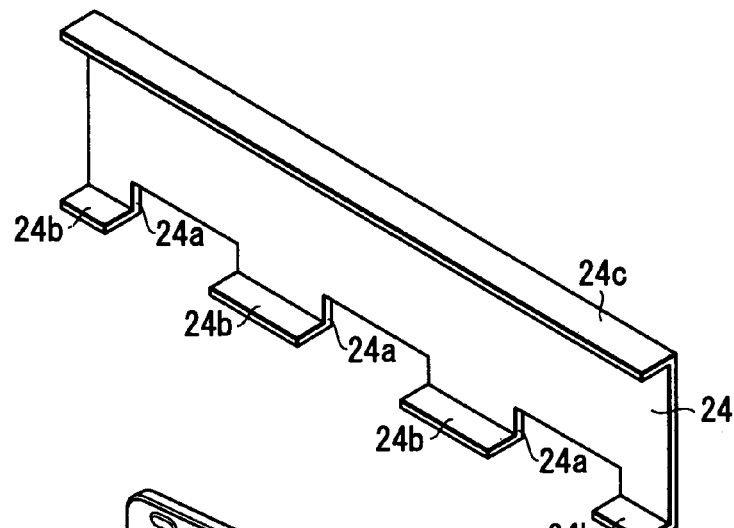
FIG. 4 is a perspective view which shows one of a plurality of heat dissipating plates mounted on a heat dissipating unit of the heat dissipating device in FIG. 1.

Now, a heat dissipating device according to a first embodiment of the present invention will be explained with reference to FIGS. 1 to 4.

The heat dissipating device 10 is used to dissipate heat, which is generated by a heat generating object 12, from the heat generating object 12. The heat generating object 12 is, for example, an electronic part such as an IC (Integrated Circuit) Chip installed on a circuit board 13 in an electronic apparatus and generating heat when it works.

The heat dissipating device 10 has a heat receiving unit 14 which receives the heat generated by the heat generating object 12. In this embodiment, the heat receiving unit 14 has a flat plate shape, and has a heat receiving surface 14a and a heat dissipating surface 14b in an opposite side of the heat receiving surface 14a. The heat receiving surface 14a is thermally connected to the heat generating object 12. This means that the heat receiving surface 14a is directly or indirectly connected to the heat generating object 12 to transfer the heat, generated by the heat generating object 12, from the heat generating object 12 to the heat receiving surface 14a. In this embodiment, a thermal connecting material 16 is attached on a predetermined portion of the heat receiving surface 14a, and the heat generating object 12 is connected to the predetermined portion of the heat receiving surface 14a through the thermal connecting material 16. The thermal connecting material 16 is a material having a good heat conductivity, and, for example, a silicone grease is well known as such material described above.

The portion of the heat receiving surface 14a, on which the thermal connecting material 16 is attached and to which the heat generating object 12 is connected through the thermal connecting material 16, is defined as a thermal connecting portion 15.

A heat transferring unit 18 is mounted on the heat dissipating surface 14b. The heat transferring unit 18 positively diffuses the heat, which is received in the heat receiving unit 14 through the heat receiving surface 14a from the heat generating object 12, to the heat dissipating surface 14b. The heat transferring unit 18 extends along the heat dissipating surface 14b of the heat receiving unit 14. A cross section of the heat transferring unit 18 in a direction, which crosses a longitudinal direction of the heat transferring unit 18, is flattened, and one of a pair of flat regions in an outer surface of the heat transferring unit 18 is thermally connected to the heat dissipating surface 14b of the heat receiving unit 14. This means that one of the paired flat regions in the outer surface of the heat transferring unit 18 is directly or indirectly connected to the heat dissipating surface 14b of the heat receiving unit 14 to transfer the heat in the heat receiving unit 14 to the heat transferring unit 18.

More specifically, the heat transferring unit 18 includes at least one heat pipe, three heat pipes 20 in this embodiment. Three heat pipes 20 extend on the heat dissipating surface 14b in parallel to each other. One 20a of a pair of flat regions 20a, 20b in an outer surface of each heat pipe 20 is thermally connected to the heat dissipating surface 14b of the heat receiving unit 14 by a connecting material 21, having a good heat conductivity, for example a solder.

The heat dissipating apparatus 10 further comprises a heat dissipating unit 22 which is mounted on the heat dissipating surface 14b of the heat receiving unit 14 and positively dissipates the heat, diffused in the heat dissipating surface 14b by the heat transfer unit 18, in an outer space. The heat dissipating unit 22 includes a plurality of heat dissipating plates 24 which are formed independently to each other.

The plural heat dissipating plates 24 stand and are perpendicular to the heat dissipating surface 14b, and extend along the heat dissipating surface 14b in parallel to each other in a direction crossing an extending direction of the heat transferring unit 18.

The heat dissipating apparatus 10 more further comprises a heat conductive cover 26 which is arranged between the heat transferring unit 18 and the heat dissipating unit 22 and covers the heat transferring unit 18. The heat conductive cover 26 is configured by a plate having a good heat conductivity, and includes heat-dissipating-surface contacting portions 26a, which are in contact with the heat dissipating surface 14b of the heat receiving unit 14, and projecting portions 26b, which receive three heat pipes 20 as the heat transferring unit 18 in this embodiment. Outer surfaces of the three heat pipes 20 are thermally connected to inner surfaces of the projecting portions 26b of the heat conductive cover 26. This means that the outer surfaces of the three heat pipes 20 are directly or indirectly connected to the inner surfaces of the projecting portions 26b of the heat conductive cover 26 to transfer the heat from the three heat pipes 20 to the projecting portions 26b of the heat conductive cover 26.

More specifically, each of the projecting portions 26b has a rectangular cross section in a direction crossing the extending direction of each of the three heat pipes 20, and the inner surface of the each projecting portion 26b at an flat projecting end 26c thereof is thermally connected to another 20b of the paired flat regions.20a, 20b in the outer surface of each heat pipe 20 by the connecting material 21, having a good heat conductivity, for example a solder.

The heat dissipating unit 22 includes recesses which fit on the projecting portions 26b of the heat conductive cover 26. More specifically, each of the plural heat dissipating plates 24 of the heat dissipating unit 22 includes recesses 24a which fit on the projecting portions 26b of the heat conductive cover 26. Each of the plural heat dissipating plates 24 further includes a plurality of fixing pieces 24b at an proximal end thereof, located near to the heat dissipating surface 14b of the heat receiving unit 14, and a pent roof piece 24c at a distal end thereof, located away from the heat dissipating surface 14b. The fixing pieces 24b are intermittently arranged at a plurality of portions in the proximal end, excluding the recesses 24a, are bend to extend along the heat-dissipating-surface contacting portions 26a of the heat conductive cover 26, and are fixed to the heat-dissipating-surface contacting portions 26a by the good heat conductive material such as a solder. The pent roof piece 24c is continuously arranged at the distal end and is bent to be in parallel to the heat dissipating surface 14b. The fixing pieces 24b and pent roof pieces 24c of the heat dissipating plates 24 are bent in the same direction and are extend in the same distance as to each other.

When the recesses 24a of the heat dissipating plates 24 are fitted on the projecting portions 26b of the heat conductive cover 26 and the fixing pieces 24b of the heat dissipating plates 24 are fixed to the heat-dissipating-surface contacting portions 26a of the heat conductive cover 26, tip ends of the fixing pieces 24b and a tip end of the pent roof piece 24c of one heat dissipating plate 24 are made in contact with the proximal end and the distal end on a side surface of the other heat dissipating plate 24, neighboring the above described one heat dissipating plate 24, the side surface of the other heat dissipating plate 24 facing in a direction opposing to the bent direction of the fixing pieces 24b and pent roof piece 24c of the other heat dissipating plate 24.

As a result, the heat dissipating plates 24 can be arranged equidistantly from each other on the heat dissipating surface 24b of the heat receiving unit 14, or on the heat conductive cover 26 in this embodiment, with a gap smaller than that in the heat dissipating fins of the above described conventional heat sink in which the heat dissipating fins are manufactured by the machinework or by the die casting. Further, the thickness of each heat dissipating plate 24 can be thinner than that of the heat dissipating fins of the above described conventional heat sink. That is, a heat dissipating efficiency in the heat dissipating plates 24 of the heat dissipating unit 22 of this embodiment is higher than that of the heat dissipating fins of the above described conventional heat sink.

Since the heat dissipating unit 22 is configured by arranging the heat dissipating plates 24, each of which has the fixing pieces 24b and the pent roof piece 24c, as described above, the heat dissipating unit 22 can have a box-like structure with a plurality of partition walls. The dissipating unit 22 configured as described above can have a strong resistance to an outer force applied to the dissipating unit 22. Further, the pent roof piece 24c of each heat dissipating plate 24 prevents the distal end of each heat dissipating plate 24 from being damaged by an outer force applied to the distal end.

As shown in FIG. 2, a center portion of the heat transferring unit 18 in its longitudinal direction, or center portions of the three heat pipes 20 in their longitudinal directions, crosses, or cross, a portion of the heat dissipating surface 14b of the heat receiving unit 14, the portion corresponding to the thermal connecting portion 15 of the heat receiving surface 14a of the heat receiving unit 14.

In the heat dissipating device 10 according to the first embodiment and configured as described above, the heat generated from the heat generating object 12 is received by the heat receiving surface 14a of the heat receiving unit 14 through the thermal connecting material 16, and then the received heat is positively transferred and diffused in the heat receiving unit 14 to the entire heat dissipating surface 14b. The heat in each of the three flattened heat pipes 20 is positively transferred to each of the flat projecting ends of the projecting portions 26b of the heat conductive cover 26 because the outer surface of each of the three flattened heat pipes 20 is in contact with the inner surface of each of the flat projecting ends of the projecting portions 26b with a large contact area between them. Further, the heat transferred to the heat conductive cover 26 is positively transferred to the plural heat dissipating plates 24 of the heat dissipating unit 22 being in contact with the heat-dissipating-surface contacting portions 26a and projecting portions 26b of the heat conductive cover 26, and finally the heat dissipating plates 24 positively dissipates the heat transferred thereto in the outer surface.

In this embodiment, the thermal connecting portion 15 is located substantially at a center of the heat receiving surface 14a. However, according to an aspect of the present invention, the thermal connecting portion 15 may be located at any portion other than the center on the heat receiving surface 14a. Since the heat pipes 20 are arranged uniformly on the heat receiving surface 14a, the heat pipes 20 cross the portion of the heat dissipating surface 14b, which corresponds to the thermal connecting portion 15 on the heat receiving surface 14a, even if the thermal connecting portion 15 is located at any portion on the heat receiving surface 14a. Therefore, the heat received in the thermal connecting portion 15 from the heat generating object 12 is diffused quickly in the entire heat receiving unit 14, regardless of the location of the thermal connecting portion 15 on the heat receiving surface 14a.

Figure 5:
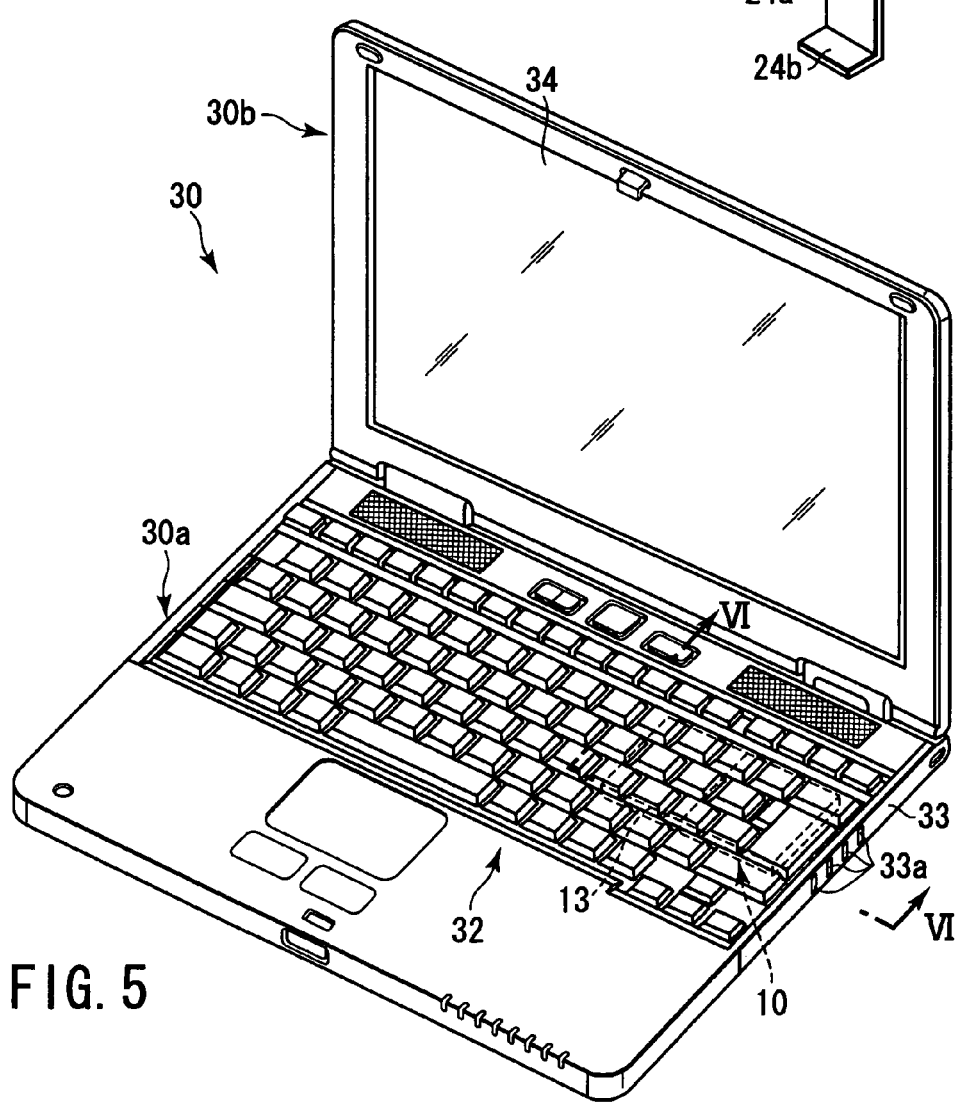
FIG. 5 is a perspective view of an electronic device which comprises the heat dissipating device in FIG. 1.

Next, an embodiment of an electronic apparatus 30, which comprises the heat dissipating device 10 described above with reference to FIGS. 1 to 4, will be explained with reference to FIGS. 5 and 6. FIG. 5 shows an outer appearance of the electronic apparatus 30, and the electronic apparatus 30 is a notebook type personal computer in this embodiment.

The notebook type personal computer comprises an operation unit 30a, that is a main body, and a display unit 30b, and the display unit 30b is connected to the operation unit 30a so that the display unit 30b is rotatable to the operation unit 30a between an open position and a closed position. At the open position, the display unit 30b is opened to the operation unit 30a, as shown in FIG. 5. At the closed position, the display unit 30b is closed to the operation unit 30a and is overlapped thereon.

The operation unit 30a includes an outer housing 33 which houses well known various input devices having a key board 32, a sound generating device such as a pair of speakers, various circuit boards having various operation circuits, a power source, etc. The display unit 30b includes a display device such as a LCD (Liquid Crystal Display) device. The various circuit boards, having various operation circuits and housed in the outer housing 33 of the operation unit 30a, that is the main body, includes the circuit board 13 on which an electronic part such an IC (Integrated Circuit) chip as the heat generating object 12 is mounted.

The heat dissipating device 10 of the first embodiment as described above, which is used to dissipate the heat generated from the heat generating object 12, is housed in the outer housing 33 of the operation unit 30a and is thermally connected to the heat generating object 12 on the circuit board 13 as described above. The heat dissipating device 10 is located at a position in the outer housing 33, the position neighboring outer communication openings 33a formed in the outer housing 33.

Figure 6:
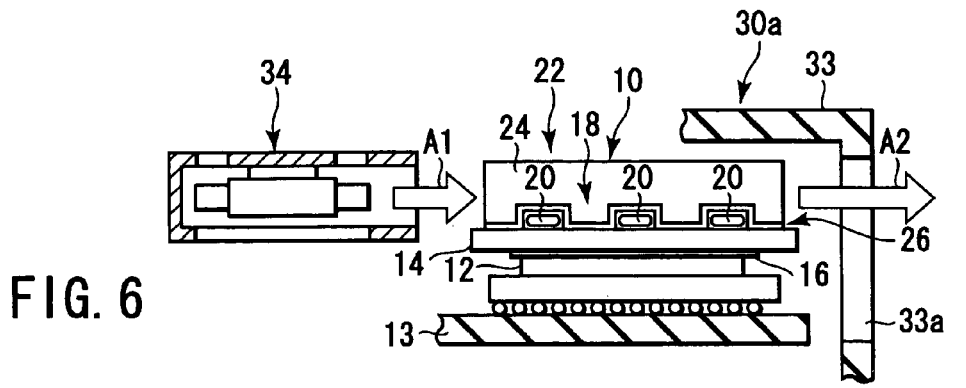
FIG. 6 is a schematic cross sectional view of a part of the electronic device in FIG. 5, the view being taken along a line of VI—VI in FIG. 5.

A conventional air blowing unit 34, communicating the outer space, is further housed in the outer housing 33, as shown in FIG. 6. The air blowing unit 34 sucks air from the outer space and blows the air toward the heat dissipating device 10 as indicating by an arrow A1 to take the heat from the heat dissipating device 10. The heated air, resulting from taking the heat from the heat dissipating device 10, is discharged to the outer space through the outer communication openings 33a, as shown in FIG. 6.

The thermal connecting portion 15, to which the heat generating object 12 is thermally connected, on the heat receiving unit 14 changes in accordance with a shape or size of the main body of the electronic apparatus 30 and an arrangement of the circuit board 13, on which the heat generating object 12 is mounted, in the main body. Such a change as described above frequently occurs in the conventional notebook type personal computers in which an attempt for making the outer size of the notebook type personal computer being smaller is performed frequently. However, in the heat dissipating device 10 according to the first embodiment, the heat received in the thermal connecting portion 15 from the heat generating object 12 is diffused positively and quickly in the entire heat dissipating surface 14b of the heat receiving unit 14, regardless of the location of the thermal connecting portion 15 on the heat receiving surface 14a of the heat receiving unit 14, as described above. Therefore, a change in the design of the heat dissipating device 10 according to the first embodiment is rarely needed in accordance with a change in the design of the electronic apparatus 30. That is, the heat dissipating device 10 according to the first embodiment has a flexible usability, and thus can be used without the change in its design even if the design of the electronic apparatus 30, in which the heat dissipating device 10 is mounted, is changed.

Next, a heat dissipating apparatus 40 according to a second embodiment of the present invention will be described with reference to FIG. 7. Most of a configuration of the heat dissipating apparatus 40 according to the second embodiment is the same as that of a configuration of the heat dissipating apparatus 10 according to the first embodiment described above with reference to FIGS. 1 to 4. Therefore, structural elements of the heat dissipating apparatus 40, which are the same as structural elements of the heat dissipating apparatus 10, are denoted by the reference numerals, which are used to denote the structural elements of the heat dissipating apparatus 10 corresponding to the structural elements of the heat dissipating apparatus 40. And, detailed descriptions about the structural elements of the heat dissipating apparatus 40, which are the same as structural elements of the heat dissipating apparatus 10, are omitted.

The heat dissipating apparatus 40 according to the second embodiment is different from the heat dissipating apparatus 10 according to the first embodiment in a shape of a cross section in a direction crossing a longitudinal direction of heat pipes 20' of a heat transferring unit 18'.

Figure 7:
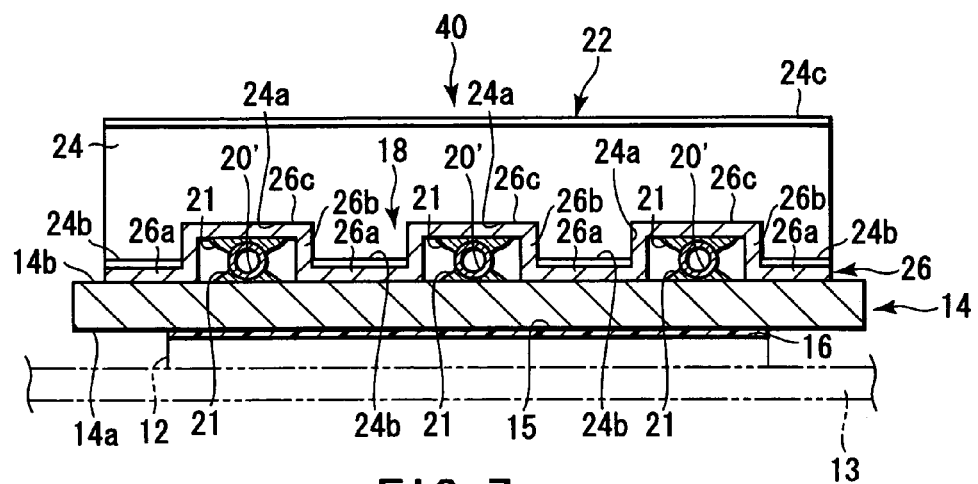
FIG. 7 is a cross sectional view of a heat dissipating device according to a second embodiment of the present invention, the view being taken along a direction which is perpendicular to a longitudinal direction of each of heat pipes included in a heat transferring unit of the heat dissipating device.

The shape of the cross section of each heat pipe 20' of the heat transferring unit 18' in the heat dissipating apparatus 40 according to the second embodiment is circular as shown in FIG. 7. In comparison of the flat-cross-sectioned heat pipe 20 of the heat transferring unit 18 in the heat dissipating apparatus 10 according to the first embodiment, the circular-cross-sectioned heat pipe 20' is in contact with the heat dissipating surface 14b of the heat receiving unit 14 and with the heat conductive cover 26 at a smaller area. Thus, a heat diffusion function of the circular-cross-sectioned heat pipe 20' on the heat dissipating surface 14b is deteriorated in a small extent than that of the flat-cross-sectioned heat pipe 20. However, a cost for manufacturing the circular-cross-sectioned heat pipe 20' is lower than that for manufacturing the flat-cross-sectioned heat pipe 20.

Figure 8:
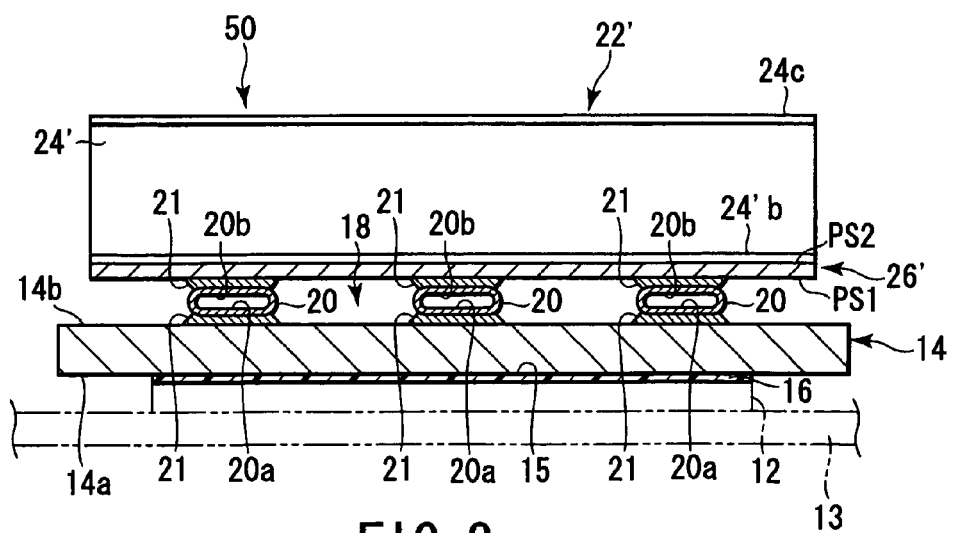
FIG. 8 is a cross sectional view of a heat dissipating device according to a third embodiment of the present invention, the view being taken along a direction which is perpendicular to a longitudinal direction of each of heat pipes included in a heat transferring unit of the heat dissipating device.

Next, a heat dissipating apparatus 50 according to a third embodiment of the present invention will be described with reference to FIGS. 8 and 9. Some of structural elements of the heat dissipating apparatus 50 according to the third embodiment are the same as some of structural elements of the heat dissipating apparatus 10 according to the first embodiment described above with reference to FIGS. 1 to 4. Therefore, some of the structural elements of the heat dissipating apparatus 50, which are the same as some of the structural elements of the heat dissipating apparatus 10, are denoted by the reference numerals, which are used to denote the structural elements of the heat dissipating apparatus 10 corresponding to the structural elements of the heat dissipating apparatus 50. And, detailed descriptions about some of the structural elements of the heat dissipating apparatus 50, which are the same as some of the structural elements of the heat dissipating apparatus 10, are omitted.

The heat dissipating apparatus 50 according to the third embodiment is different from the heat dissipating apparatus 10 according to the first embodiment in a configuration of a heat conductive cover 26', which covers the three flattened heat pipes 20 of the heat transferring unit 18, and in a configuration of a heat dissipating unit 22', which is thermally connected the three flattened heat pipes 20 of the heat transferring unit 18 through the heat conductive cover 26'.

In this embodiment, the heat conductive cover 26' has a flat plate shape, and each of a plurality of heat dissipating plates 24' of the heat dissipating unit 22' does not have recesses at its proximal end near to the heat dissipating surface 62b of the heat receiving unit 62. But, the proximal end of each heat dissipating plate 24' is bent to form continuously a fixing piece 24'b, which extends in a direction and distance in which the continuously pent roof piece 24a of its distal end extends.

One PS1 of a pair of flat surfaces PS1, PS2 of the flat-plate-shaped heat conductive cover 26' is fixed to the above described another flat region 20b in the outer surface of each flattened heat pipe 20 of the heat transferring unit 18 by the well known good heat conductive material such as the solder 21, and the continuous fixing piece 24'b of each heat dissipating plate 24' of the heat dissipating unit 22' is fixed to another PS2 of the pair of flat surfaces PS1, PS2 of the flat-plate-shaped heat conductive cover 26' by the well known good heat conductive material such as the solder 21.

In contrast to the heat dissipating device 10 according to the first embodiment, in which the recesses 24a is formed in the proximal end of each heat dissipating plate 24 of the heat dissipating unit 22, the proximal end being located near to the heat dissipating surface 14b of the heat receiving unit 14, the heat conductive cover 26' has the flat plate shape and no recess is formed in the proximal end of each heat dissipating plate 24' of the heat dissipating unit 22', the proximal end being located near to the heat dissipating surface 14b of the heat receiving unit 14, in the heat dissipating device 50 according to the third embodiment. Therefore, if a heat dissipating performance of the heat dissipating device 50 of the third embodiment is the same as that of the heat dissipating device 10 of the first embodiment, an outer size of the heat dissipating device 50 of the third embodiment, especially a dimension of each heat dissipating plate 24 in a rose direction thereof from the heat dissipating surface 14b of the heat receiving unit 22 (that is, a height of each heat dissipating plate 24), is some what large to that of the heat dissipating device 10 of the first embodiment, but a manufacturing cost of the heat dissipating device 50 of the third embodiment is lower than that of the heat dissipating device 10 of the first embodiment.

Each of the three heat pipes 20 of the heat transferring unit 18 in the heat dissipating device 50 of this embodiment can be made to have a circular cross section as the cross section of each of the three heat pipes 20' of the heat transferring unit 18 in the heat dissipating device 40 of the second embodiment described above with reference to FIG. 7. In this modification, the heat dissipating performance is some what lowered and the outer size, especially the height, is some what increased, but the manufacturing cost is further lowered.

Next, a heat dissipating device 60 according to a fourth embodiment of the present invention will be described with reference to FIGS. 10 and 11.

Similarly to the first to third heat dissipating devices 10, 40, and 50, the heat dissipating device 60 of the fourth embodiment is used to transfer and dissipate the heat generated from the heat generating object 12 as the electronic part such as the IC (Integrated Circuit) chip, which is installed on the. circuit board 13 in the electronic apparatus and generates heat when it works.

The heat dissipating device 60 comprises a heat receiving unit 62 which receives the heat generated from the heat generating object 12. In this embodiment, the heat receiving unit 62 has a flat plate shape, and has a heat receiving surface 62*a* and a heat dissipating surface 62*b* in an opposite side of the heat receiving surface 62*a*. The heat receiving surface 62*a* is thermally connected to the heat generating object 12. This means that the heat receiving surface 62*a* is directly or indirectly connected to the heat generating object 12 to transfer the heat, generated by the heat generating object 12, from the heat generating object 12 to the heat receiving surface 62*a*. In this embodiment, the thermal connecting material 16 is attached on a predetermined portion of the heat receiving surface 62*a*, and the heat generating object 12 is connected to the predetermined portion of the heat receiving surface 62*a* through the thermal connecting material 16. The thermal connecting material 16 is a material having a good heat conductivity, and, for example, a silicone grease is well known as such material described above.

The portion of the heat receiving surface 62*a*, on which the thermal connecting material 16 is attached and to which the heat generating object 12 is connected through the thermal connecting material 16, is defined as a thermal connecting portion 63.

A heat transferring unit 64 is mounted on the heat receiving surface 62*a* of the heat receiving unit 62, excluding the thermal connecting portion 63. The heat transferring unit 64 positively diffuses the heat, which is received in the heat receiving unit 62 through the heat receiving surface 62*a* from the heat generating object 12, in the heat receiving surface 62*a*. The heat transferring unit 64 extends along the heat receiving surface 62*a* of the heat receiving unit 62, excluding the thermal connecting portion 63.

A cross section of the heat transferring unit 64 in a direction, which crosses a longitudinal direction of the heat transferring unit 64, is flattened, and one of a pair of flat regions in an outer surface of the heat transferring unit 64 is thermally connected to the heat receiving surface 62*a* of the heat receiving unit 62. This means that one of the paired flat regions in the outer surface of the heat transferring unit 64 is directly or indirectly connected to the heat receiving surface 62*a* of the heat receiving unit 62 to transfer the heat in the heat receiving unit 62 to the heat transferring unit 64.

More specifically, the heat transferring unit 64 includes at least one heat pipe, two heat pipes 66 in this embodiment. Two heat pipes 66 extend on the heat receiving surface 62*a* in parallel to each other in both sides of the thermal connecting portion 63. One 66*b* of a pair of flat regions 66*a*, 66*b* in an outer surface of each heat pipe 66 is thermally connected to the heat receiving surface 62*a* of the heat receiving unit 62 by a connecting material 68, having a good heat conductivity, for example a solder.

The heat dissipating device 60 further comprises a heat dissipating unit 70 which is mounted on the heat dissipating surface 62*b* of the heat receiving unit 62 and positively dissipates the heat, diffused positively in the heat receiving unit 62 by the heat transferring unit 64 on the heat receiving surface 62*a*, in an outer space. The heat dissipating unit 70 includes a plurality of heat dissipating plates 72 which are formed independently to each other.

The plural heat dissipating plates 72 stand and are perpendicular to the heat dissipating surface 62*b*, and extend along the heat dissipating surface 62*b* in parallel to each other in a direction crossing an extending direction of the heat transferring unit 64.

Each of the plural heat dissipating plates 72 of the heat dissipating unit 70 includes a fixing piece 72*a*, which is continuously arranged at an proximal end thereof located near to the heat dissipating surface 62*b* of the heat receiving unit 62, and a continuous pent roof piece 72*b*, which is continuously arranged at a distal end thereof located away from the heat dissipating surface 62*b*. The fixing piece 72*a* is bend to extend along the heat dissipating surface 62b, and is fixed to the heat dissipating surface 62*b* by a good heat conductive material such as a solder. The pent roof piece 72*b* is bent to be in parallel to the heat dissipating surface 62*b*. The fixing pieces 72*a* and pent roof pieces 72*b* of the heat dissipating plates 72 are bent in the same direction and are extend in the same distance as to each other.

When the fixing pieces 72*a* of the heat dissipating plates 72 are fixed to the heat dissipating surface 62*b* of the heat receiving unit 62, a tip end of the fixing piece 72*a* and a tip end of the pent roof piece 72*b* of one heat dissipating plate 72 are made in contact with the proximal end and the distal end on a side surface of the other heat dissipating plate 72, neighboring the above described one heat dissipating plate 72, the side surface of the other heat dissipating plate 72 facing in a direction opposing to the bent direction of the fixing piece 72*a* and pent roof piece 72*b* of the other heat dissipating plate 72.

As a result, the heat dissipating plates 72 can be arranged equidistantly from each other on the heat dissipating surface 62*b* of the heat receiving unit 62 with a gap smaller than that in the heat dissipating fins of the above described conventional heat sink in which the heat dissipating fins are manufactured by the machinework or by the die casting. Further, the thickness of each heat dissipating plate 72 can be thinner than that of the heat dissipating fins of the above described conventional heat sink. That is, a heat dissipating efficiency in the heat dissipating plates 72 of the heat dissipating unit 70 of this embodiment is higher than that of the heat dissipating fins of the above described conventional heat sink.

Since the heat dissipating unit 70 is configured by arranging the heat dissipating plates 72, each of which has the fixing piece 72*a* and the pent roof piece 72*b*, as described above, the heat dissipating unit 70 can have a box-like structure with a plurality of partition walls. The dissipating unit 70 configured as described above can have a strong resistance to an outer force applied to the dissipating unit 70. Further, the pent roof piece 72*b* of each heat dissipating plate 72 prevents the distal end of each heat dissipating plate 72 from being damaged by an outer force applied to the distal end.

In comparison to the heat dissipating device 10 according to the first embodiment, in which the heat conductive cover 26 is used and the recesses 24*a* are formed in the proximal end of each of the heat dissipating plates 24 of the heat dissipating unit 22, the proximal end being located near to the heat dissipating surface 14*b* of the heat receiving unit 14, the heat conductive cover 26 is not used and no recess is formed in the proximal end of each of the heat dissipating plates 72 of the heat dissipating unit 70, the proximal end being located near to the heat dissipating surface 62*b* of the heat receiving unit 62, in the heat dissipating device 60 according to the fourth embodiment and configured as described above. Further, the two heat pipes 66 of the heat transferring unit 64 are mounted on the heat receiving surface 62a of the heat receiving unit 14 with excluding the thermal connecting portion 63, and the heat dissipating plates 24 of the heat dissipating unit 22 is mounted on the heat dissipating surface 62b of the heat receiving unit 14. Therefore, if a heat dissipating performance of the heat dissipating device 60 of the fourth embodiment is the same as that of the heat dissipating device 10 of the first embodiment, an outer size of the heat dissipating device 60 of the fourth embodiment, especially a dimension of the heat dissipating device 60 in a rose direction thereof (that is, a height of the heat dissipating device 60), is substantially the same as that of the heat dissipating device 10 of the first embodiment, the structure of the heat dissipating device 60 is more simple than that of the heat dissipating device 10, and a manufacturing cost of the heat dissipating device 60 of the fourth embodiment is lower than that of the heat dissipating device 10 of the first embodiment. But, since the two heat pipes 66 of the heat transferring unit 64 must be mounted on the heat receiving surface 62a of the heat receiving unit 62 with excluding the thermal connecting portion 63, the arrangement of the thermal connecting portion 63 on the heat receiving surface 62a of the heat receiving unit 62 is limited.

In this embodiment, the cross section of each of the two heat pipes 66 of the heat transferring unit 64 can be made circular as the cross section of the three heat pipes 20' of the heat transferring unit 18 in the heat dissipating device 40 of the second embodiment in FIG. 7. However, with this modification, an outer size of the heat dissipating device 60 of the fourth embodiment, especially the height of the heat dissipating device 60, becomes larger, the arrangement of the thermal connecting portion 63 on the heat receiving surface 62a of the heat receiving unit 14 becomes being more limited, and the heat dissipating efficiency becomes being more lowered.

Further, in the heat dissipating device 60 according to the fourth embodiment and described above with reference to FIGS. 10 and 11, at least one additional heat pipe can be mounted on the heat receiving surface 62a of the heat receiving unit 62 with excluding the thermal connecting portion 63.

FIG. 12 shows two additional heat pipes 66', which are arranged on the heat receiving surface 62a in both sides of the thermal connecting portion 63 along an extending direction of each heat pipe 66 between the two heat pipes 66.

Additional advantages and modifications will readily occur to those skilled in the art. Therefore, the invention in its broader aspect is not limited to the specific details and representative embodiments shown and described herein. Accordingly, various modifications may be made without departing from the spirit or scope of the general inventive concept as defined by the appended claims and their equivalents.

What is claimed is:

1. A heat dissipating device which dissipates heat from a heat generating object, comprising:
    a heat receiving unit having a heat receiving surface and a heat dissipating surface on an opposite side of the heat receiving surface, the heat receiving surface being thermally coupled to the heat generating object;
    a heat transferring unit, mounted on the heat dissipating surface of the heat receiving unit, which transfers the heat received by the heat receiving surface and diffuses the transferred heat over the heat dissipating surface;
    a heat dissipating unit, mounted on the heat dissipating surface of the heat receiving unit, which dissipates the diffused heat; and
    a heat conductive cover, arranged between the heat transferring unit and the heat dissipating unit, that covers the heat transferring unit,
    wherein the heat transferring unit includes a plurality of heat pipes each of which has a long shape and extends in the same direction as to each other along the heat dissipating surface of the heat receiving unit,
    wherein the heat conductive cover is configured as a plate, and includes a portion, which contacts the heat dissipating surface of the heat receiving unit, and a plurality of projecting portions, each of which projects from the heat dissipating surface, receives each of the heat pipes of the heat transferring unit, and has an inner surface being thermally connected to the outer surface of each heat pipe received therein, and
    wherein the heat dissipating unit includes a plurality of heat dissipating plates which are formed independently to each other and arranged in the extending direction of each heat pipe to separate from each other, each heat dissipating plate extending in a direction which crosses the extending direction of each heat pipe and having a plurality of recesses which fit on the projecting portions of the heat conductive cover and are thermally connected thereto.

2. The heat dissipating device of claim 1, wherein a cross section of each heat pipe of the heat transferring unit along a direction crossing the extending direction thereof is flattened,
    a cross section of each projecting portion of the heat conductive cover along the direction crossing the extending direction of each heat pipe is flattened,
    one of a pair of flat regions in the outer surface of the flattened cross section of each heat pipe is thermally connected to the heat dissipating surface of the heat receiving unit, and
    another of the pair of flat regions in the outer surface of the flattened cross section of each heat pipe is thermally connected to a flattened portion of the inner surface of each projecting portion of the heat conductive cover, the flattened portion of the inner surface facing the heat dissipating surface of the heat receiving unit.

3. A heat dissipating device which dissipates heat from a heat generating object, comprising:
    a heat receiving unit having a heat receiving surface and a heat dissipating surface on an opposite side of the heat receiving surface, the heat receiving surface being thermally coupled to the heat generating object;
    a heat transferring unit mounted on the heat receiving surface of the heat receiving unit excluding a portion of the heat receiving surface that is thermally connected to the heat generating object, the heat transferring unit configured to transfer the heat received in the heat receiving surface and to diffuse the transferred heat in the heat receiving unit; and
    a heat dissipating unit, mounted on the heat dissipating surface of the heat receiving unit, that dissipates the diffused heat,
    wherein the heat transferring unit includes a plurality of heat pipes each of which has a long shape and extends in the same direction as to each other along the heat receiving surface of the heat receiving unit that excludes a portion of the heat receiving surface thermally connected to the heat generating object, and wherein the heat dissipating unit includes a plurality of heat dissipating plates which are formed independently to each other and arranged in the extending direction of each heat pipe to separate from each other, each heat dissipating plate extending in a direction which crosses the extending direction of each heat pipe.

4. The heat dissipating device of claim 3, wherein a cross section of each heat pipe of the heat transferring unit along a direction crossing the extending direction thereof is flattened, and one of a pair of flat regions in the outer surface of the flattened cross section of each heat pipe is thermally connected to the heat receiving surface of the heat receiving unit that excludes a portion of the heat receiving surface thermally connected to the heat generating object.

5. An electronic apparatus, comprising:

a circuit board including an electronic part generating heat;

a main body installing the circuit board; and a heat dissipating device which is installed in the main body and dissipates heat from the electronic part, the heat dissipating device comprising:

(a) a heat receiving unit having a heat receiving surface and a heat dissipating surface in an opposite side of the heat receiving surface, the heat receiving surface being thermally connected to the electronic part;

(b) a heat transferring unit mounted on the heat dissipating surface of the heat receiving unit, transferring the heat received in the heat receiving surface, and diffusing the transferred heat over the heat dissipating surface;

(c) a heat dissipating unit mounted on the heat dissipating surface of the heat receiving unit, and dissipating the diffused heat; and (d) a heat conductive cover which is arranged between the heat transferring unit and the heat dissipating unit, and covers the heat transferring unit, wherein the heat transferring unit includes a plurality of heat pipes each of which has a long shape and extends in the same direction as to each other along the heat dissipating surface of the heat receiving unit, wherein the heat conductive cover is configured by a plate, and includes a portion, which contacts the heat dissipating surface of the heat receiving unit, and a plurality of projecting portions, each of which projects from the heat dissipating surface, receives each of the heat pipes of the heat transferring unit, and has an inner surface being thermally connected to the outer surface of each heat pipe received therein, and wherein the heat dissipating unit includes a plurality of heat dissipating plates which are formed independently to each other and arranged in the extending direction of each heat pipe to separate from each other, each heat dissipating plate extending in a direction which crosses the extending direction of each heat pipe and having a plurality of recesses which fit on the projecting portions of the heat conductive cover and are thermally connected thereto.

6. The electronic apparatus of claim 5, wherein a cross section of each heat pipe of the heat transferring unit along a direction crossing the extending direction thereof is flattened, a cross section of each projecting portion of the heat conductive cover along the direction crossing the extending direction of each heat pipe is flattened, one of a pair of flat regions in the outer surface of the flattened cross section of each heat pipe is thermally connected to the heat dissipating surface of the heat receiving unit, and another of the pair of flat regions in the outer surface of the flattened cross section of each heat pipe is thermally connected to a flattened portion of the inner surface of each projecting portion of the heat conductive cover, the flattened portion of the inner surface facing the heat dissipating surface of the heat receiving unit.

7. An electronic apparatus, comprising:

a circuit board including an electronic part generating heat;

a main body installing the circuit board; and a heat dissipating device which is installed in the main body and dissipates heat from the electronic part, the heat dissipating device comprising:

(a) a heat receiving unit having a heat receiving surface and a heat dissipating surface in an opposite side of the heat receiving surface, the heat receiving surface being thermally connected to the electronic part, (b) a heat transferring unit mounted on the heat receiving surface of the heat receiving unit with excluding a part of the heat receiving surface thermally connected to the electronic part, transferring the heat received in the heat receiving surface, and diffusing the transferred heat in the heat receiving unit; and (c) a heat dissipating unit mounted on the heat dissipating surface of the heat receiving unit, and dissipating the diffused heat, wherein the heat transferring unit includes a plurality of heat pipes each of which has a long shape and extends in the same direction as to each other along the heat receiving surface of the heat receiving unit with excluding a part of the heat receiving surface thermally connected to the electronic part, and wherein the heat dissipating unit includes a plurality of heat dissipating plates which are formed independently to each other and arranged in the extending direction of each heat pipe to separate from each other, each heat dissipating plate extending in a direction which crosses the extending direction of each heat pipe.

8. The electronic apparatus of claim 7, wherein a cross section of each heat pipe of the heat transferring unit along a direction crossing the extending direction thereof is flattened, and one of a pair of flat regions in the outer surface of the flattened cross section of each heat pipe is thermally connected to the heat receiving surface of the heat receiving unit with excluding a part of the heat receiving surface thermally connected to the electronic part.

* * * * *